United States Patent
Liaw

(10) Patent No.: US 11,024,632 B2
(45) Date of Patent: Jun. 1, 2021

(54) SEMICONDUCTOR STRUCTURE FOR SRAM CELL

(71) Applicant: Taiwan Semiconductor Manufacturing Co., Ltd., Hsinchu (TW)

(72) Inventor: Jhon-Jhy Liaw, Zhudong Township, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 104 days.

(21) Appl. No.: 16/548,313

(22) Filed: Aug. 22, 2019

(65) Prior Publication Data

US 2021/0057421 A1   Feb. 25, 2021

(51) Int. Cl.
*H01L 27/11* (2006.01)
*G11C 11/412* (2006.01)
*G11C 5/06* (2006.01)

(52) U.S. Cl.
CPC .......... *H01L 27/1104* (2013.01); *G11C 5/063* (2013.01); *G11C 11/412* (2013.01)

(58) Field of Classification Search
CPC .... H01L 27/1104; G11C 5/063; G11C 11/412
See application file for complete search history.

(56) References Cited

U.S. PATENT DOCUMENTS

| | | | |
|---|---|---|---|
| 8,625,334 B2 | 1/2014 | Liaw | |
| 8,879,305 B2 | 11/2014 | Liaw | |
| 8,995,176 B2 * | 3/2015 | Liaw | .................. H01L 27/0924 365/154 |
| 9,858,985 B2 * | 1/2018 | Liaw | .................... G11C 11/417 |

* cited by examiner

*Primary Examiner* — Peniel M Gumedzoe
(74) *Attorney, Agent, or Firm* — McClure, Qualey & Rodack, LLP

(57) ABSTRACT

A semiconductor structure is provided. The semiconductor structure includes a substrate and a plurality of memory cells arranged in a cell array over the substrate. Each of the memory cells includes a latch circuit, a pass-gate transistor, and an isolation transistor. The latch circuit is formed by two cross-coupled inverters. The pass-gate transistor is coupled between an output terminal of the latch circuit and a bit line. The isolation transistor includes a drain and a gate, both coupled to the output terminal of the latch circuit, and a source that is floating. A first gate length of the isolation transistor is greater than a second gate length of the pass-gate transistor and a plurality of transistors within the latch circuit.

20 Claims, 10 Drawing Sheets

SEMICONDUCTOR STRUCTURE FOR SRAM CELL

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

Static Random Access Memory (SRAM) is commonly used in integrated circuits. SRAM cells have the advantageous feature of being able to hold data without the need to refresh. With the increasingly demanding requirements on the speed of integrated circuits, the read speed and write speed of SRAM cells have also become more important. With increased down-scaling of the already very small SRAM cells, however, such requests are difficult to achieve.

BRIEF DESCRIPTION OF THE DRAWINGS

Aspects of the present disclosure are best understood from the following detailed description when read with the accompanying figures. It should be noted that, in accordance with the standard practice in the industry, various nodes are not drawn to scale. In fact, the dimensions of the various nodes may be arbitrarily increased or reduced for clarity of discussion.

DETAILED DESCRIPTION

Figure 1A:
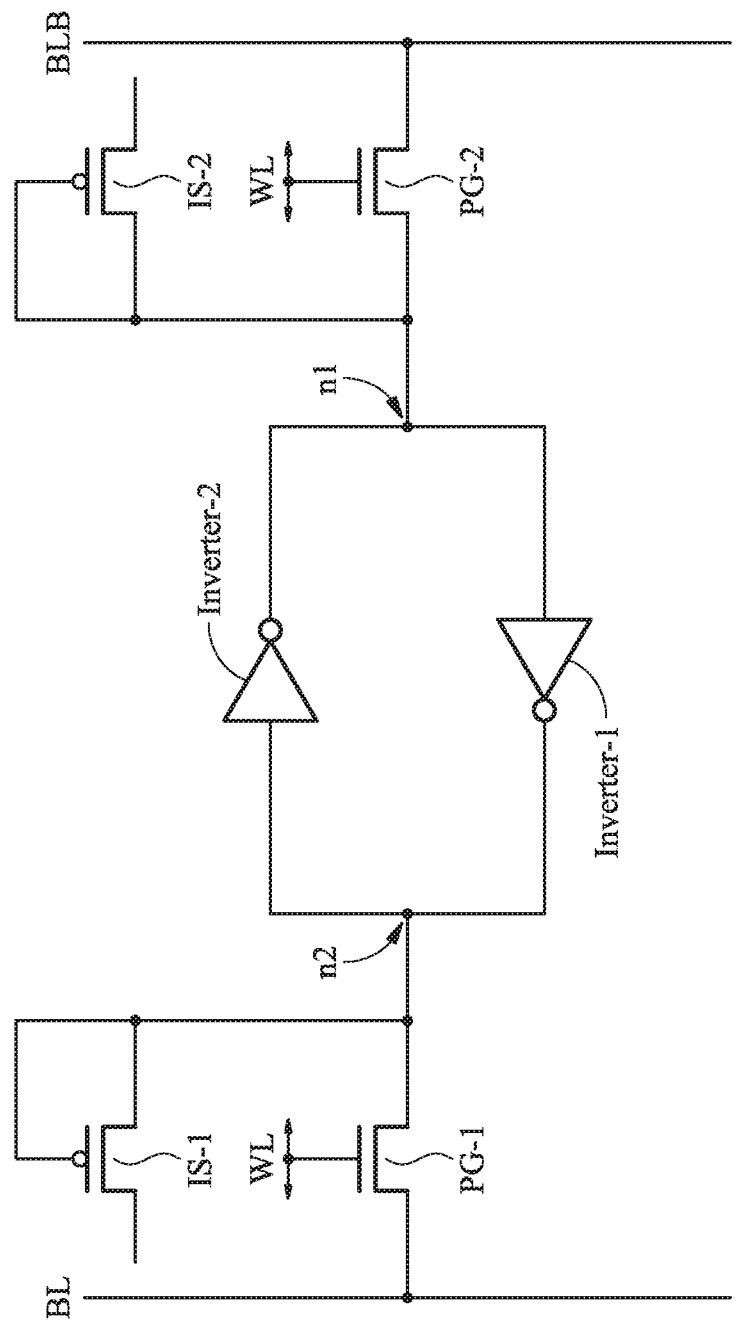
FIG. 1A illustrates a memory cell, in accordance with some embodiments of the disclosure

The following disclosure provides many different embodiments, or examples, for implementing different nodes of the subject matter provided. Specific examples of components and arrangements are described below to simplify the present disclosure. These are, of course, merely examples and are not intended to be limiting. In some embodiments, the formation of a first node over or on a second node in the description that follows may include embodiments in which the first and the second nodes are formed in direct contact, and may also include embodiments in which additional nodes may be formed between the first and the second nodes, such that the first and the second nodes may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various semiconductor structures of integrated circuits (ICs) are provided in accordance with various exemplary embodiments. Some variations of some embodiments are discussed. Throughout the various views and illustrative embodiments, like reference numbers are used to designate like elements.

In an IC, each memory includes multiple memory cells arranged in multiple rows and multiple columns of a cell array. In some embodiments, the memory cells have the same circuit configuration and the same semiconductor structure. In some embodiments, the memory cell may be a bit cell of SRAM.

FIG. 1A illustrates a memory cell 10, in accordance with some embodiments of the disclosure. In this embodiment, the memory cell 10 is a single-port SRAM bit cell. The memory cell 10 includes a pair of cross-coupled inverters Inverter-1 and Inverter-2, two pass-gate transistors PG-1 and PG-2, and two isolation transistors IS-1 and IS-2. The inverters Inverter-1 and Inverter-2 are cross-coupled between the nodes n2 and n1, and form a latch circuit. In some embodiments, one of nodes n2 and n1 is used as an output terminal of the latch circuit and the other node is used as an input terminal of the latch circuit. The pass-gate transistor PG-1 is coupled between a bit line BL and the node n2, and the pass-gate transistor PG-2 is coupled between a complementary bit line BLB and the node n1, wherein the complementary bit line BLB is complementary to the bit line BL. The gates of the pass-gate transistors PG-1 and PG-2 are coupled to the same word-line WL. Furthermore, the pass-gate transistors PG-1 and PG-2 are NMOS transistors. The gate and the drain of the isolation transistor IS-1 are coupled to the node n2, and the source of the isolation transistor IS-1 is floating. Moreover, the gate and the drain of the isolation transistor IS-2 are coupled to the node n1, and the source of the isolation transistor IS-2 is floating. In the memory cell 10, the isolation transistors IS-1 and IS-2 are PMOS transistors.

Figure 1B:
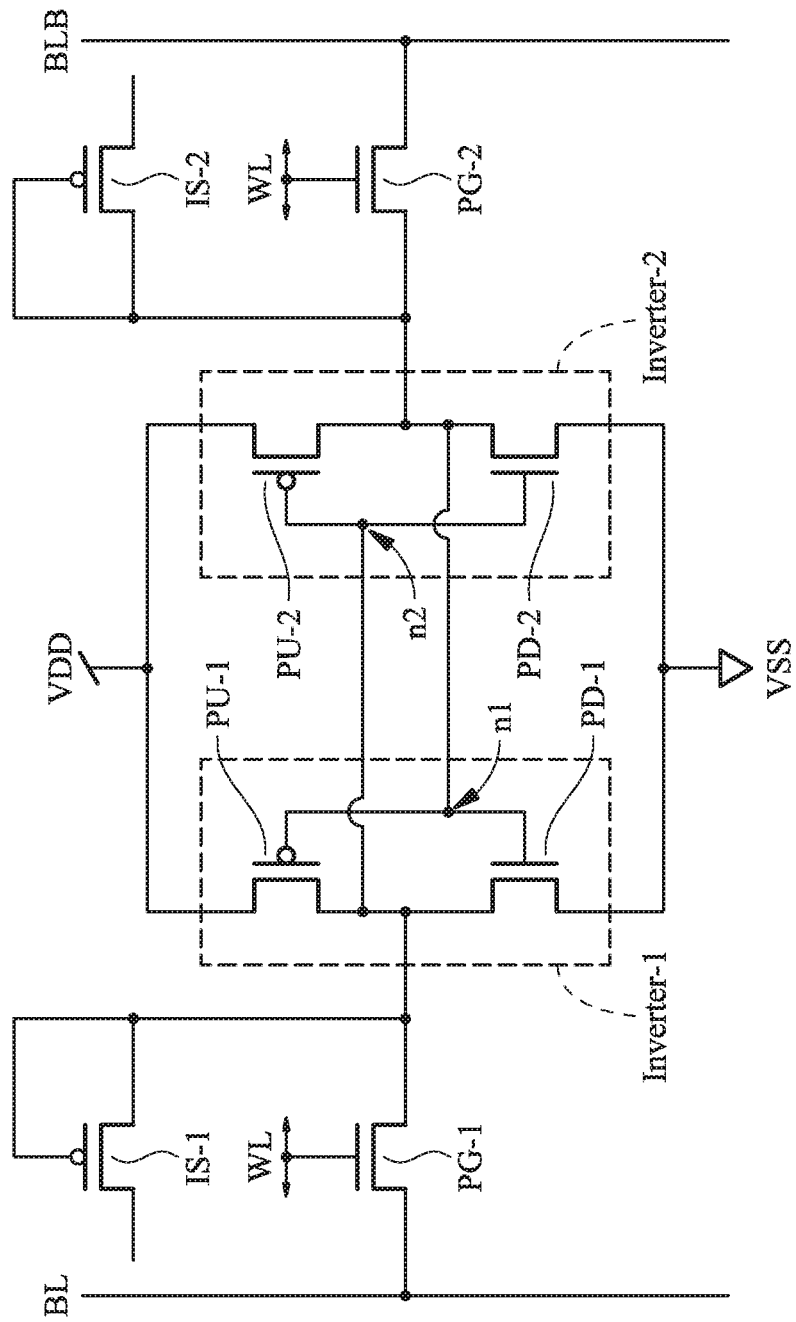
FIG. 1B shows a simplified diagram of the memory cell of FIG. 1A, in accordance with some embodiments of the disclosure.

FIG. 1B shows a simplified diagram of the memory cell 10 of FIG. 1A, in accordance with some embodiments of the disclosure. The inverter Inverter-1 includes a pull-up transistor PU-1 and a pull-down transistor PD-1. The pull-up transistor PU-1 is a PMOS transistor, and the pull-down transistor PD-1 is an NMOS transistor. The drain of the pull-up transistor PU-1 and the drain of the pull-down transistor PD-1 are coupled to the node n2 connecting the pass-gate transistor PG-1. The gates of the pull-up transistor PU-1 and the pull-down transistor PD-1 are coupled to the node n1 connecting the pass-gate transistor PG-2. Furthermore, the source of the pull-up transistor PU-1 is coupled to the power supply VDD, and the source of the pull-down transistor PD-1 is coupled to a ground VSS.

Similarly, the inverter Inverter-2 includes a pull-up transistor PU-2 and a pull-down transistor PD-2. The pull-up transistor PU-2 is a PMOS transistor, and the pull-down transistor PD-2 is an NMOS transistor. The drains of the pull-up transistor PU-2 and the pull-down transistor PD-2 are coupled to the node n1 connecting the pass-gate transistor PG-2. The gates of the pull-up transistor PU-2 and the pull-down transistor PD-2 are coupled to the node n2 connecting the pass gate transistor PG-1. Furthermore, the source of the pull-up transistor PU-2 is coupled to the power supply VDD, and the source of the pull-down transistor PD-2 is coupled to the ground VSS.

The drain and the gate of the isolation transistor IS-1 are both coupled to the node n2, and the drain and the gate of the isolation transistor IS-2 are both coupled to the node n1. The sources of the isolation transistors IS-1 and IS-2 are depicted as floating. In some embodiments, the sources of the isolation transistors IS-1 and IS-2 may be coupled to respective isolation transistors IS-1/IS-2 in adjacent memory cells 10.

In some embodiments, the pass-gate transistors PG-1 and PG-2, the pull-up transistors PU-1 and PU-2, the pull-down transistors PD-1 and PD-2, and the isolation transistors IS-1 and IS-2 of the memory cell 10 are FinFETs. In some embodiments, the pass-gate transistors PG-1 and PG-2 and the pull-down transistors PD-1 and PD-2 are the single-fin FETs or the multiple-fin FETs, and the pull-up transistors PU-1 and PU-2 are the single-fin FETs. In some embodiments, the pass-gate transistors PG-1 and PG-2, the pull-up transistors PU-1 and PU-2, the pull-down transistors PD-1 and PD-2, and the isolation transistors IS-1 and IS-2 of the memory cell 10 are gate all around (GAA) FETs.

Figure 2:
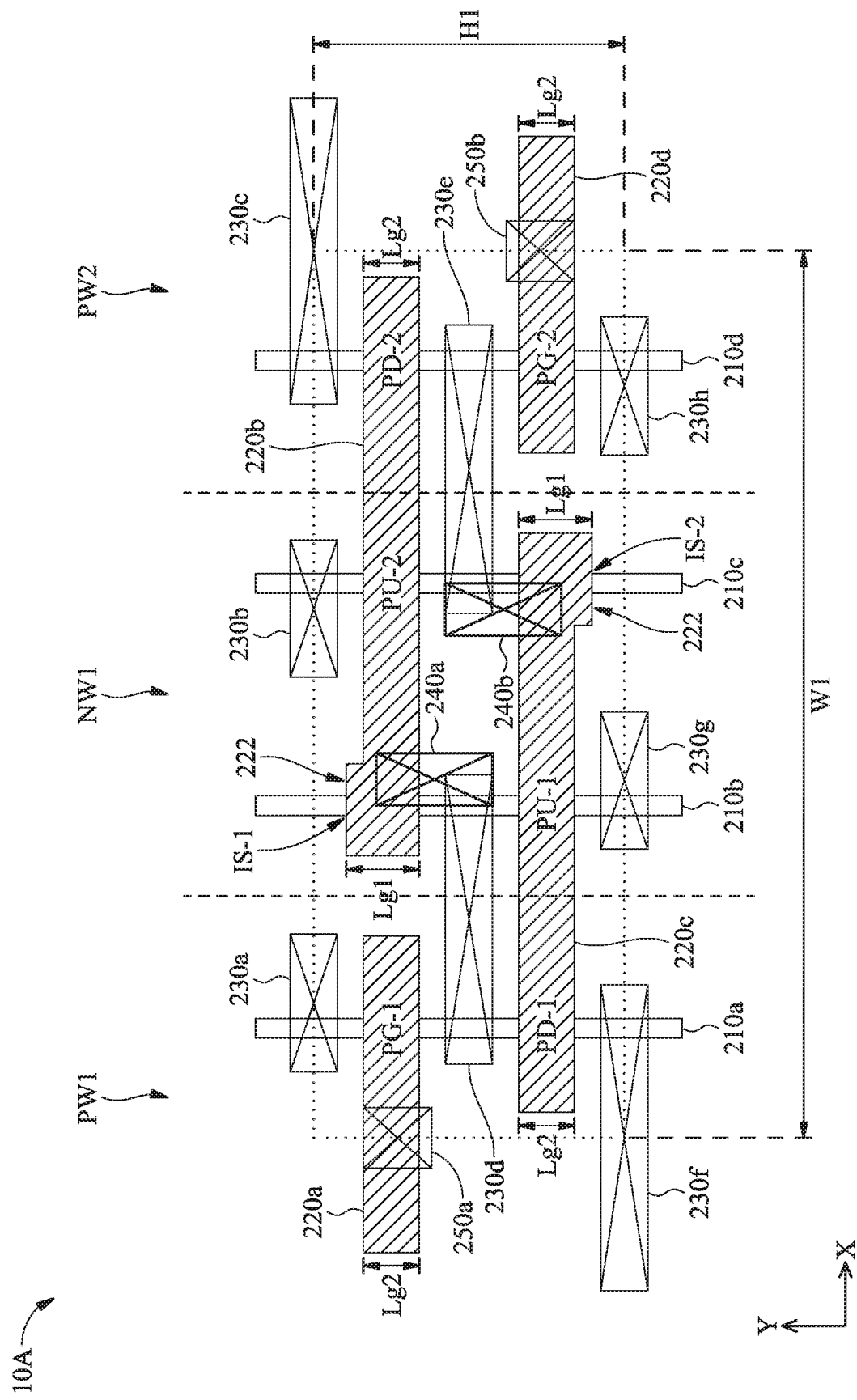
FIG. 2 illustrates the layout of the semiconductor structure of a memory cell, in accordance with some embodiments of the disclosure.

FIG. 2 illustrates the layout of the semiconductor structure of a memory cell 10A, in accordance with some embodiments of the disclosure. The memory cell 10A is a single-port SRAM bit cell of FIGS. 1A and 1B. A plurality of memory cells 10A can be implemented in a memory of an IC. The outer boundary of the memory cell 10A is illustrated using dashed lines. Furthermore, the memory cell 10A has a cell weight (or X-pitch) W1 along the X-direction and a cell height (or Y-pitch) H1 along the Y-direction. As described above, the memory cell 10A are arranged in multiple rows and multiple columns of a cell array in an IC.

An N-type well region NW1 is at the middle of memory cell 10A, and two P-type well regions PW1 and PW2 are on opposite sides of N-type well region NW1. The semiconductor fin 210a extending in the Y-direction is formed over the P-type well region PW1, and the semiconductor fin 210d extending in the Y-direction is formed over the P-type well region PW2. Moreover, the semiconductor fins 210b and 210c extending in the Y-direction are formed over the N-type well region NW1. The semiconductor fins 210a through 210d are the continuous fin lines across the memory cells 10A arranged in the same column of the cell array. In other words, the semiconductor fins 210a through 210d are shared by the memory cells 10A arranged in the same column of the cell array, i.e., no broken process is performed to cut the semiconductor fins 210a through 210d within the memory cells 10A arranged in the same column of the cell array. Thus, margin and cost reduction are decreased for SRAM cell manufacturing. For example, the continuous fin lines may have one cut step and no fin broken mask, thereby reducing costs (e.g., including the cost of one mask process and one etch process). Compared with the semiconductor fins formed by non-regular patterns (e.g., with a short fin length or random dense/isolate fin space), the fin profile of the continuous fin lines, such as fin angle and surface roughness, will not be impacted. Thus, poor performance (e.g., drain induced barrier lowering (DIBL) degradation) and the worst device (or cell) matching are avoided.

In some embodiments, the semiconductor fins 210a through 210d are Si fins. In some embodiments, the semiconductor fins 210a and 210d over the P-type well regions PW1 and PW2 are Si fins, and the semiconductor fins 210b and 210c over the N-type well region NW1 are SiGe fins. In some embodiments, the Ge atomic concentration of the SiGe fins is from about 5% to about 35%.

The gate electrode 220a forms the pass-gate transistor PG-1 with the underlying semiconductor fin 210a over the P-type well region PW1. Furthermore, the gate electrode 220a is coupled to the corresponding contact 250a for coupling to the word-line WL. The gate electrode 220c forms the pull-down transistor PD-1 with the underlying semiconductor fin 210a over the P-type well region PW1. In other words, the semiconductor fin 210a is shared by the pass-gate transistor PG-1 and the pull-down transistor PD-1 of the memory cell 10A. Furthermore, the semiconductor fin 210a is shared by the pass-gate transistor PG-1 and the pull-down transistor PD-1 of each of the memory cells 10A arranged in the same column of the cell array.

The gate electrode 220c further forms the pull-up transistor PU-1 with an underlying semiconductor fin 210b and the isolation transistor IS-2 with an underlying semiconductor fin 210c over the N-type well region NW1. In other words, the gate electrode 220c is shared by the pull-up transistor PU-1, the pull-down transistor PD-1, and the isolation transistor IS-2.

The gate electrode 220b forms the pull-down transistor PD-2 with an underlying semiconductor fin 210d in the P-type well region PW2. Furthermore, the gate electrode 220b forms the pull-up transistor PU-2 with the underlying semiconductor fin 210c and the isolation transistor IS-1 with the underlying semiconductor fin 210b over the N-type well region NW1. In other words, the gate electrode 220b is shared by the pull-up transistor PU-2, the pull-down transistor PD-2 and the isolation transistor IS-1. The semiconductor fin 210b is shared by the pull-up transistor PU-1 and the isolation transistor IS-1 of the memory cell 10A. Furthermore, the semiconductor fin 210b is shared by the pull-up transistor PU-1 and the isolation transistor IS-1 of each of the memory cells 10A arranged in the same column of the cell array. Similarly, the semiconductor fin 210c is shared by the pull-up transistor PU-2 and the isolation transistor IS-2 of the memory cell 10A. Furthermore, the semiconductor fin 210c is shared by the pull-up transistor PU-2 and the isolation transistor IS-2 of each of the memory cells 10A arranged in the same column of the cell array.

The gate electrode 220d forms the pass-gate transistor PG-2 with the underlying semiconductor fin 210d. In other words, the semiconductor fin 210d is shared by the pass-gate transistor PG-2 and the pull-down transistor PD-2. Furthermore, the semiconductor fin 210c is shared by the pass-gate transistor PG-2 and the pull-down transistor PD-2 of each of the memory cells 10A arranged in the same column of the cell array. Moreover, the gate electrode 220d is coupled to the corresponding contact 250b for coupling to the word-line WL.

The contacts 230f and 230c are used to connect to the sources of the pull-down transistors PD-1 and PD-2 to the VSS lines (e.g., the ground VSS) through the corresponding vias (not shown). The contacts 230f and 230c have lengthwise directions parallel to the X direction, and may be formed to overlap the corners of the memory cell 10A. The contacts 230g and 230b are used to connect to the sources of pull-up transistors PU-1 and PU-2 to the VDD lines (e.g., the supply voltage VDD) through the corresponding vias (not shown). Additionally, the contact 230a is used to connect to the source/drain region of pass-gate transistor PG-1 to a bit line BL through the corresponding via (not shown). The contact 230h is used to connect to the source/drain region of the pass-gate transistor PG-2 to a complementary bit line BLB through the corresponding via (not shown).

The contact 230d is a longer contact, and is elongated and has a longitudinal direction in the X direction, which is parallel to the extending directions of the gate electrodes 220a through 220d. The contact 240a is a butt contact, and is elongated and has a longitudinal direction in the Y direction, The contact 240a includes a portion over, and electrically connected to, the gate electrode 220b. In the manufacturing of the memory cell 10A on the semiconductor wafers, the contact 230d and the contact 240a may be formed as a single continuous butt contact. The drain region of the pull-up transistor PU-1 is coupled to the drain region of the pull-down transistor PD-1 and the pass-gate transistor PG-1 through the contact 230d. Moreover, the contact 230d is coupled to the gate electrode 220b through the contact 240a.

The contact 230e is a longer contact, and is elongated and has a longitudinal direction in the X direction, which is parallel to the extending directions of the gate electrodes 220a through 220d. The contact 240b is a butt contact, and is elongated and has a longitudinal direction in the Y direction, The contact 240b includes a portion over, and electrically connected to, the gate electrode 220c. In the manufacturing of the memory cell 10A on the semiconductor wafers, the contact 230e and the contact 240b may be formed as a single continuous butt contact. The drain of the pull-up transistor PU-2 is coupled to the drain of the pull-down transistor PD-2 and the pass-gate transistor PG-2 through the contact 230e. Moreover, the contact 230e is coupled to the gate electrode 220c through the contact 240b.

The gate electrode 220b further forms the isolation transistor IS-1 with the underlying semiconductor fin 210b over the N-type well region NW1. Compared with the pull-up transistor PU-2 and the pull-down transistor PD-2 that share the same gate electrode 220b, the gate length Lg1 of the isolation transistor IS-1 is different than the gate length Lg2 of the pull-up transistor PU-2 and the pull-down transistor PD-2. The gate length Lg1 and the gate length Lg2 are obtained along the direction of the semiconductor fins 210a through 210d. In FIG. 2, the gate electrode 220b has an extra portion (e.g., a jog) 222 that form the longer gate length Lg1, i.e., Lg1>Lg2. In some embodiments, the gate length difference between the gate lengths Lg1 and Lg2 is greater than 2 nm. In some embodiments, a ratio of the gate lengths Lg1 and Lg2 is greater than 10%.

Similarly, the gate electrode 220c forms the isolation transistor IS-2 with the underlying semiconductor fin 210c over the N-type well region NW1. Compared with the pull-up transistor PU-1 and the pull-down transistor PD-1 that share the same gate electrode 220c, the gate length Lg1 of the isolation transistor IS-2 is different than the gate length Lg2 of the pull-up transistor PU-1 and the pull-down transistor PD-1. As described above, the gate electrode 220c has an extra portion (e.g., a jog) 222 that form the longer gate length Lg1, i.e., Lg1>Lg2. In some embodiments, the gate length difference between the gate lengths Lg1 and Lg2 is greater than 2 nm. In some embodiments, a ratio of the gate lengths Lg1 and Lg2 is greater than 10%.

In some embodiments, the gate length of the pull-up transistors PU-1 and PU-2, the pull-down transistors PD-1 and PD-2, and the pass-gate transistors PG-1 and PG-2 are the same, e.g., the gate length Lg2.

In some embodiments, the extra portion 222 of the gate electrode 220c is formed without additional processes, and no extra cost or area penalty for the isolation transistors IS-1 and IS-2. Furthermore, due to the longer gate length Lg1, the threshold (Isoff) leakage is decreased, and the isolation margin between the source/drain region and the butt contact (e.g., 240a, 240b) is increased for the isolation transistors IS-1 and IS-2.

In some embodiments, the transistors in the memory cell 10A are selected from a group consisting of FINFET structure, vertical gate all around (GAA), horizontal GAA, nano wire, nano sheet, and a combination thereof.

By using the continuous fin lines in the memory cell 10A, the fin profile are uniformly controlled. The memory cell 10A has fully symmetry (or balance) fin environment in SRAM area. Therefore, the pull-down transistors PD-1 and PD-2, the pass-gate transistors PG-1 and PG-2, and the pull-up transistors PU-1 and PU-2 have the same fin profile, thus improving the devices stability and cell matching. For the SRAM, the device stability will benefit the chip speed, and cell matching can achieve lower power supply VDD (e.g., Vcc_min).

Figure 3:
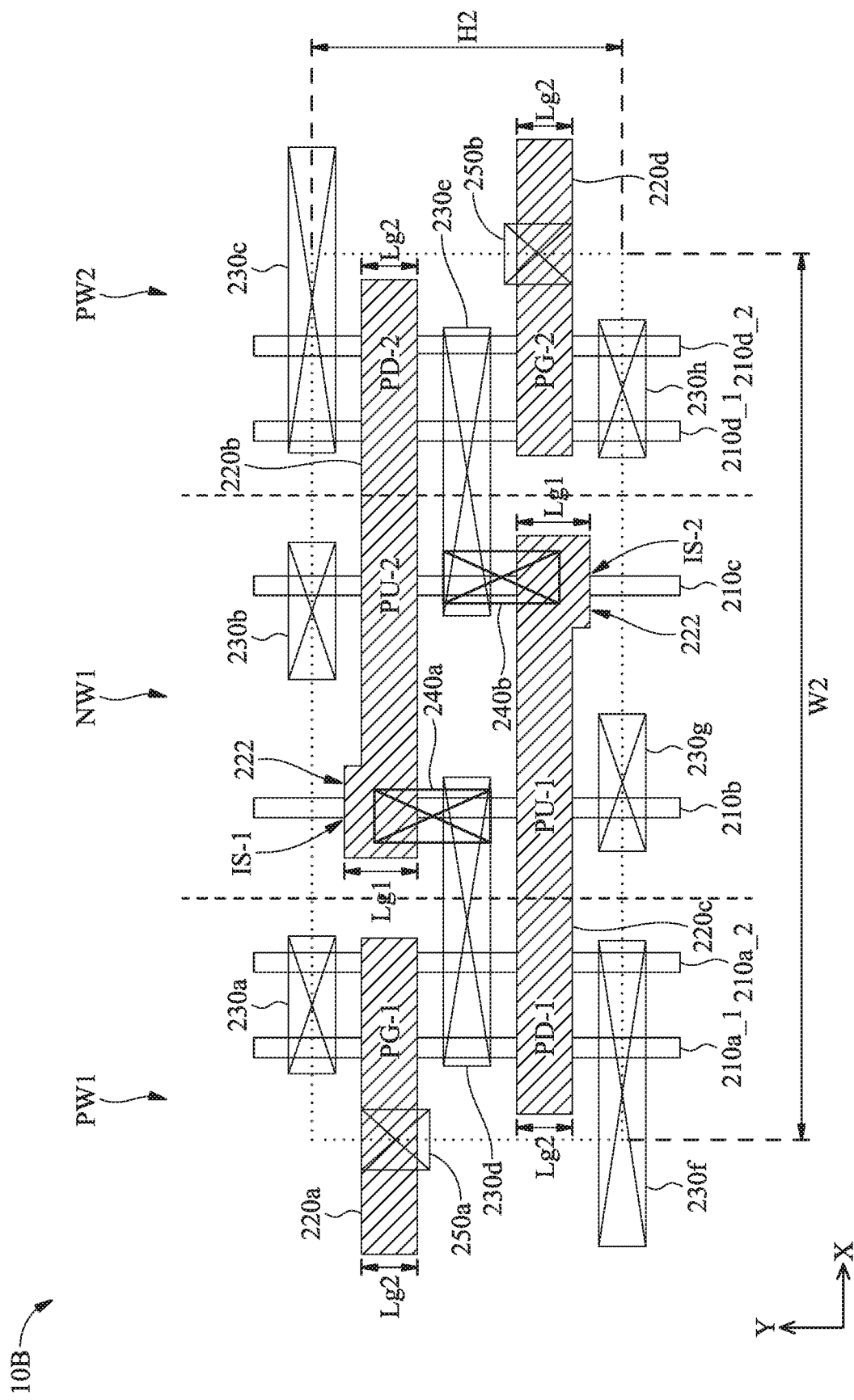
FIG. 3 illustrates the layout of the semiconductor structure of a memory cell, in accordance with some embodiments of the disclosure.

FIG. 3 illustrates the layout of the semiconductor structure of a memory cell 10B, in accordance with some embodiments of the disclosure. The memory cell 10B is a single-port SRAM bit cell of FIGS. 1A and 1B. A plurality of memory cells 10B can be implemented in a memory of an IC. The outer boundary of the memory cell 10B is illustrated using dashed lines. Furthermore, the memory cell 10B has a cell weight W2 along the X-direction and a cell height H2 along the Y-direction. In some embodiments, the cell height H2 of the memory cell 10B is equal to the cell height H1 of the memory cell 10A of FIG. 2. Furthermore, the cell weight W2 of the memory cell 10B is greater than or equal to the cell weight W1 of the memory cell 10A of FIG. 2.

The configuration of the memory cell 10B of FIG. 3 is similar to the configuration of the memory cell 10A of FIG. 2. The difference between the memory cell 10A and the memory cell 10B is that the pass-gate transistors PG-1 and PG-2 and the pull-down transistors PD-1 and PD-2 are the multiple-fin FETs in the memory cell 10B. For example, the channel regions of the pass-gate transistor PG-1 and the pull-down transistor PD-1 are formed by the semiconductor fins 210a_1 and 210a_2 extending in the Y-direction, and the semiconductor fins 210a_1 and 210a_2 are formed over the P-type well region PW1. Furthermore, the channel regions of the pass-gate transistor PG-2 and the pull-down transistor PD-2 are formed by the semiconductor fins 210d_1 and 210d_2 extending in the Y-direction, and the semiconductor fins 210d_1 and 210d_2 are formed over the P-type well region PW2. Furthermore, the semiconductor fins in FIG. 3 are the continuous fin lines across the memory cells 10B arranged in the same column of the cell array. In other words, the semiconductor fins in FIG. 3 are shared by the memory cells 10A arranged in the same column of the cell array. In some embodiments, the semiconductor fins 210a_1, 210a_2, 210d_1 and 210d_2 over the P-type well regions PW1 and PW2 are Si fins.

Figure 4:
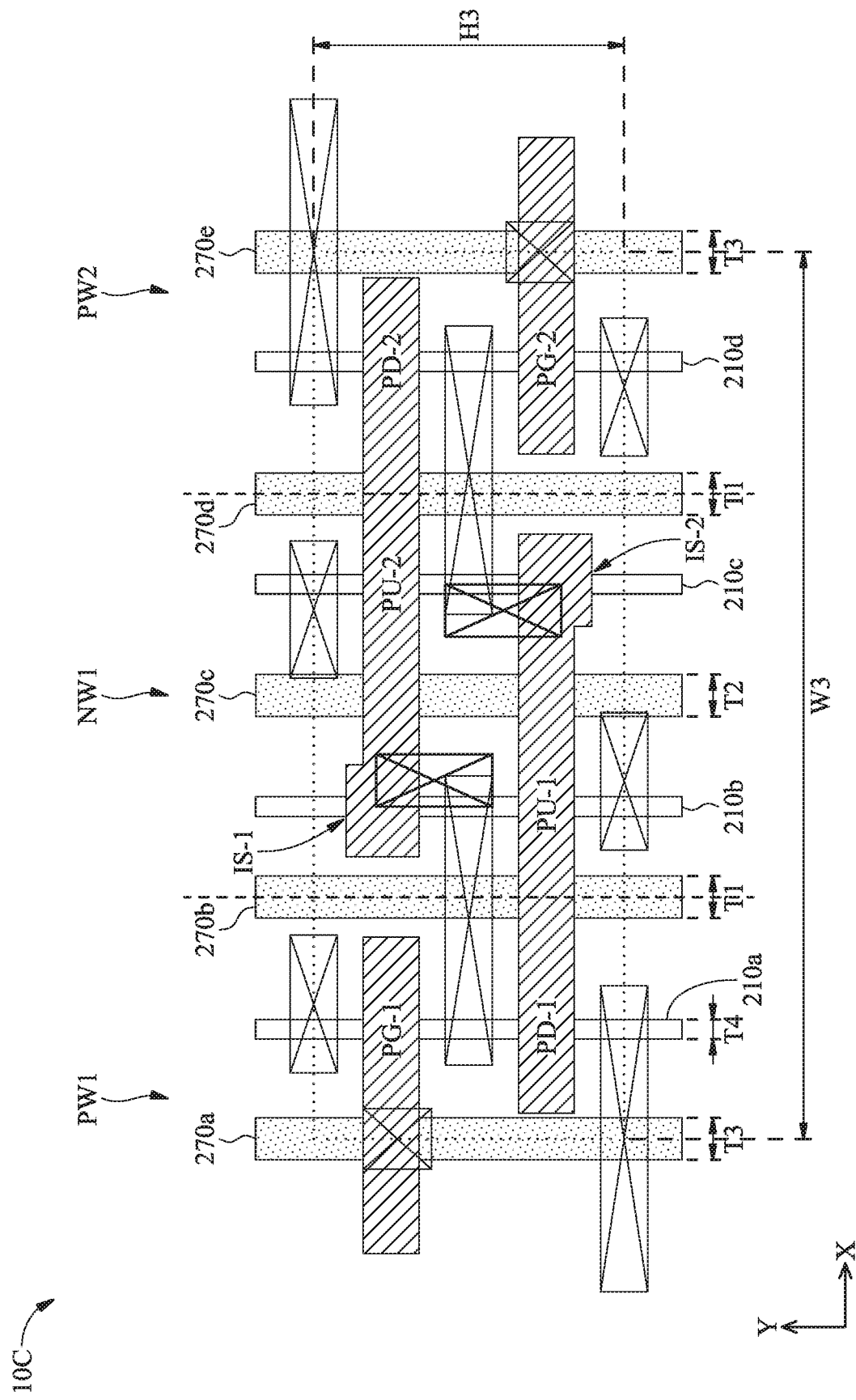
FIG. 4 illustrates the layout of the semiconductor structure of a memory cell, in accordance with some embodiments of the disclosure.

FIG. 4 illustrates the layout of the semiconductor structure of a memory cell 10C, in accordance with some embodiments of the disclosure. The memory cell 10C is a single-port SRAM bit cell of FIGS. 1A and 1B. As described above, A plurality of memory cell 10A can be arranged in multiple rows and multiple columns of a cell array in an IC. The outer boundary of the memory cell 10C is illustrated using dashed lines. Furthermore, the memory cell 10C has a cell weight W3 along the X-direction and a cell height H3 along the Y-direction. In some embodiments, the cell height H3 of the memory cell 10C is equal to the cell height H1 of the memory cell 10A of FIG. 2. Furthermore, the cell weight W3 of the memory cell 10C may be equal to the cell weight W1 of the memory cell 10A of FIG. 2.

The configuration of the memory cell 10C in FIG. 4 is similar to the configuration of the memory cell 10A in FIG. 2. The difference between the memory cell 10A and the memory cell 10C is that the memory cell 10C further includes the dielectric-base fins 270a through 270e extending in the Y-direction. The dielectric-base fins 270a and 270e are disposed at the cell boundary and shared with the adjacent memory cells 10C (not shown). Furthermore, the dielectric-base fins 270b, 270c and 270d are disposed in cell inner of the memory cell 10C. The dielectric-base fins 270a through 270e are the continuous fin lines across the memory cells 10C arranged in the same column of the cell array. In other words, the dielectric-base fins 270a through 270e are shared by the memory cells 10C arranged in the same column of the cell array.

In the memory cell 10C, the dielectric-base fin 270a has a width T3, and the dielectric-base fin 270a is disposed at the left boundary of the memory cell 10C and over the P-type well region PW1. The dielectric-base fin 270b has a width T1, and the dielectric-base fin 270b is disposed between the semiconductor fins 210a and 210b and over an interface between the P-type well region PW1 and the N-type well region NW1. The dielectric-base fin 270c has a width T2, and the dielectric-base fin 270c is disposed between the semiconductor fins 210b and 210c and over the N-type well region NW1. The dielectric-base fin 270d has a width T1, and the dielectric-base fin 270d is disposed between the semiconductor fins 210c and 210d and over an interface between the P-type well region PW2 and the N-type well region NW1. Furthermore, the dielectric-base fin 270e has a width T3, and the dielectric-base fin 270e is disposed at the right boundary of the memory cell 10C and over the P-type well region PW2.

In the memory cell 10C, the semiconductor fins 210a through 210d and the dielectric-base fins 270a through 270e are alternately arranged. For example, the semiconductor fin 210a is disposed between the dielectric-base fins 270a and 270b, and the semiconductor fin 210b is disposed between the dielectric-base fins 270b and 270c. Furthermore, the semiconductor fin 210c is disposed between the dielectric-base fins 270c and 270d, and the semiconductor fin 210d is disposed between the dielectric-base fins 270d and 270e.

In the memory cell 10C, two adjacent transistors corresponding to different semiconductor fins are separated by the dielectric-base fin. For example, the pass-gate transistor PG-1 corresponding to the semiconductor fin 210a and the isolation transistor IS-1 corresponding to the semiconductor fin 210b are separated by the dielectric-base fin 270b. Furthermore, the pull-down transistor PD-1 corresponding to the semiconductor fin 210a and the pull-up transistor PU-1 corresponding to the semiconductor fin 210b are separated by the dielectric-base fin 270b.

Similarly, the pass-gate transistor PG-2 and the isolation transistor IS-2 are separated by the dielectric-base fin 270d. The pull-down transistor PD-2 and the pull-up transistor PU-2 are separated by the dielectric-base fin 270d. The isolation transistor IS-1 and the pull-up transistor PU-2 are separated by the dielectric-base fin 270c. The isolation transistor IS-2 and the pull-up transistor PU-1 are separated by the dielectric-base fin 270c.

The widths T1, T2 and T3 of the dielectric-base fins 270a through 270e are wider than the width T4 of the semiconductor fins 210a through 210d. Furthermore, the widths T1, T2 and T3 of the dielectric-base fin 270a through 270e are within a range from about 5 nm to about 40 nm. In some embodiments, a ratio of the width T1, T2 or T3 and the width T4 is within a range from about 1.2 to about 3. In some embodiments, the dielectric-base fins 270a through 270e have similar widths, e.g., T1≈T2≈T3. In some embodiments, the width T3 is wider than the widths T1 and T2. In other words, the dielectric-base fins disposed at the cell boundary (e.g., the dielectric-base fins 270a and 270e) have wider width than the dielectric-base fins in cell inner (e.g., the dielectric-base fins 270b, 270c and 270d). In some embodiments, a ratio of the width T3 and the width T1/T2 is greater than about 10%.

In some embodiments, the source/drain regions of the pass-gate transistor PG-1 and the pull-down transistor PD-1 over the P-type well region PW1 are in contact with sidewall of the dielectric-base fins 270a and/or 270b. Furthermore, the source/drain regions of the pass-gate transistor PG-2 and the pull-down transistor PD-2 over the P-type well region PW2 are in contact with sidewall of the dielectric-base fins 270e and/or 270d. In some embodiments, when the width T3 is wider than the widths T1 and T2, the source/drain regions of the pass-gate transistor PG-1 and the pull-down transistor PD-1 are in contact with the dielectric-base fin 270a, and the source/drain regions of the pass-gate transistor PG-2 and the pull-down transistor PD-2 are in contact with the dielectric-base fin 270e.

The dielectric-base fins 270a through 270e are formed by a single dielectric layer or multiple dielectric layers with material selected from a group consisting of $SiO_2$, SiOC, SiON, SiOCN, Carbon oxide, Nitrogen oxide, Carbon and Nitrogen oxide, metal oxide dielectric, Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), multiple metal oxide, or a combination thereof.

The dielectric-base fins 270a through 270e are used to prevent the source/drain epitaxy-growth bridge concern and also allowed the source/drain epitaxy size to the maximum. Thus, the memory cell of SRAM can be continuously scaled with the source/drain isolation margin improvement. Furthermore, contact landing issue (i.e., narrow area) of the transistors of the memory cell formed by single fin can be solved for contact resistance reduction. In general, the transistor formed by the single fin is also provided the additional benefit on cell standby leakage reduction due to less width.

Furthermore, the source/drain regions can be increased for the single fin transistor, so as to have more volume for the strain layer (e.g., SiP, SiPC for NMOS FETs and SiGe for PMOS FETs). Thus, a fastest and smallest SRAM cell is obtained.

Figure 5:
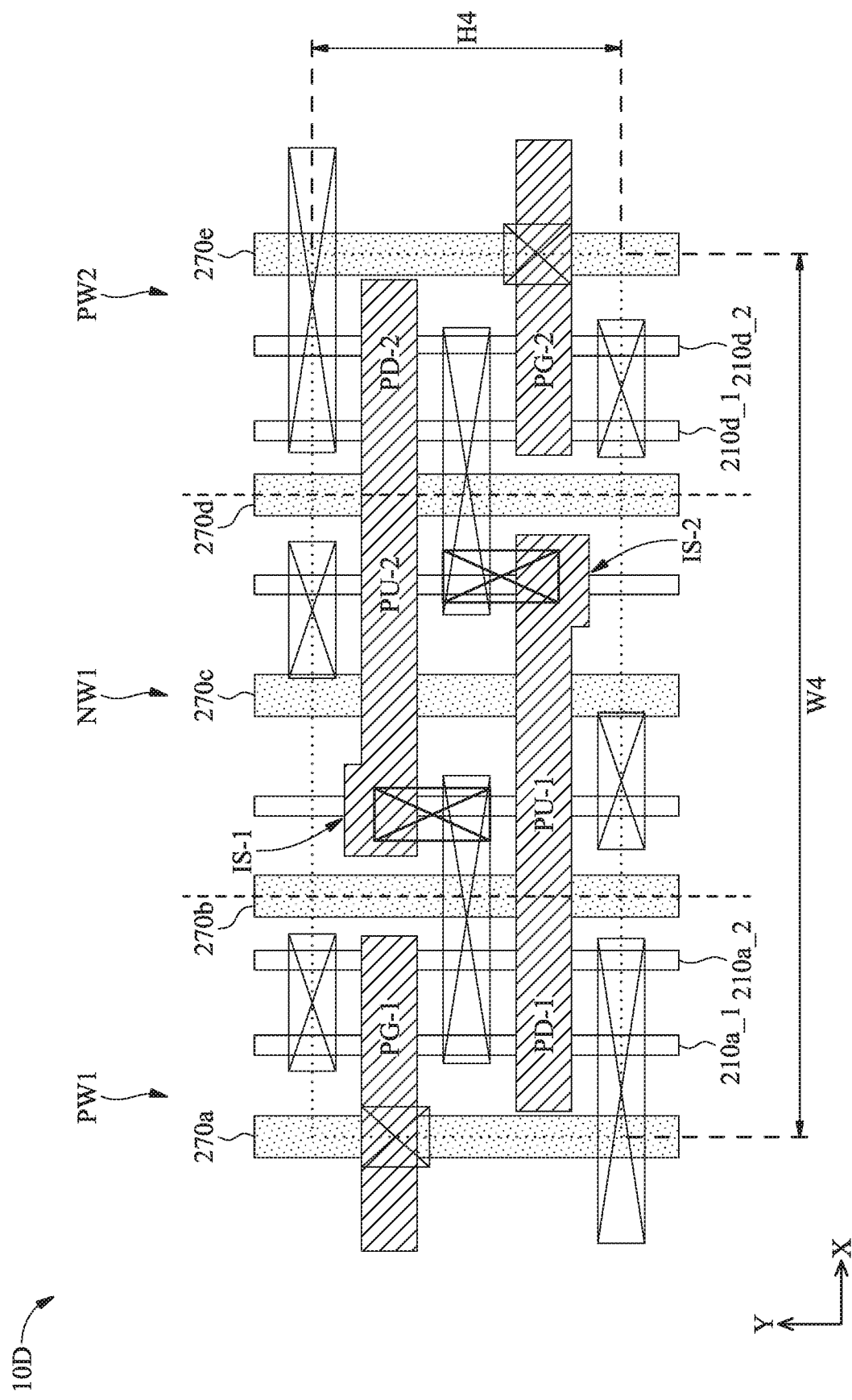
FIG. 5 illustrates the layout of the semiconductor structure of a memory cell, in accordance with some embodiments of the disclosure.

FIG. 5 illustrates the layout of the semiconductor structure of a memory cell 10D, in accordance with some embodiments of the disclosure. The memory cell 10D is a single-port SRAM bit cell of FIGS. 1A and 1B. A plurality of memory cells 10D can be implemented in a memory of an IC. The outer boundary of the memory cell 10D is illustrated using dashed lines. Furthermore, the memory cell 10D has a cell weight W4 along the X-direction and a cell height H4 along the Y-direction. In some embodiments, the cell height H4 of the memory cell 10D may be equal to the cell height H2 of the memory cell 10B of FIG. 3. Furthermore, the cell weight W4 of the memory cell 10D may be equal to the cell weight W2 of the memory cell 10B of FIG. 3.

The configuration of the memory cell 10D in FIG. 5 is similar to the configuration of the memory cell 10B in FIG. 3. The difference between the memory cell 10B and the memory cell 10D is that the memory cell 10D further includes the dielectric-base fins 270a through 270e extending in the Y-direction. The dielectric-base fins 270a and 270e are disposed at the cell boundary and shared with the adjacent memory cells 10D (not shown). Furthermore, the dielectric-base fins 270b, 270c and 270d are disposed in cell inner of the memory cell 10D. The dielectric-base fins 270a through 270e have been described in FIG. 4 and will therefore not be described again herein.

Figure 6:
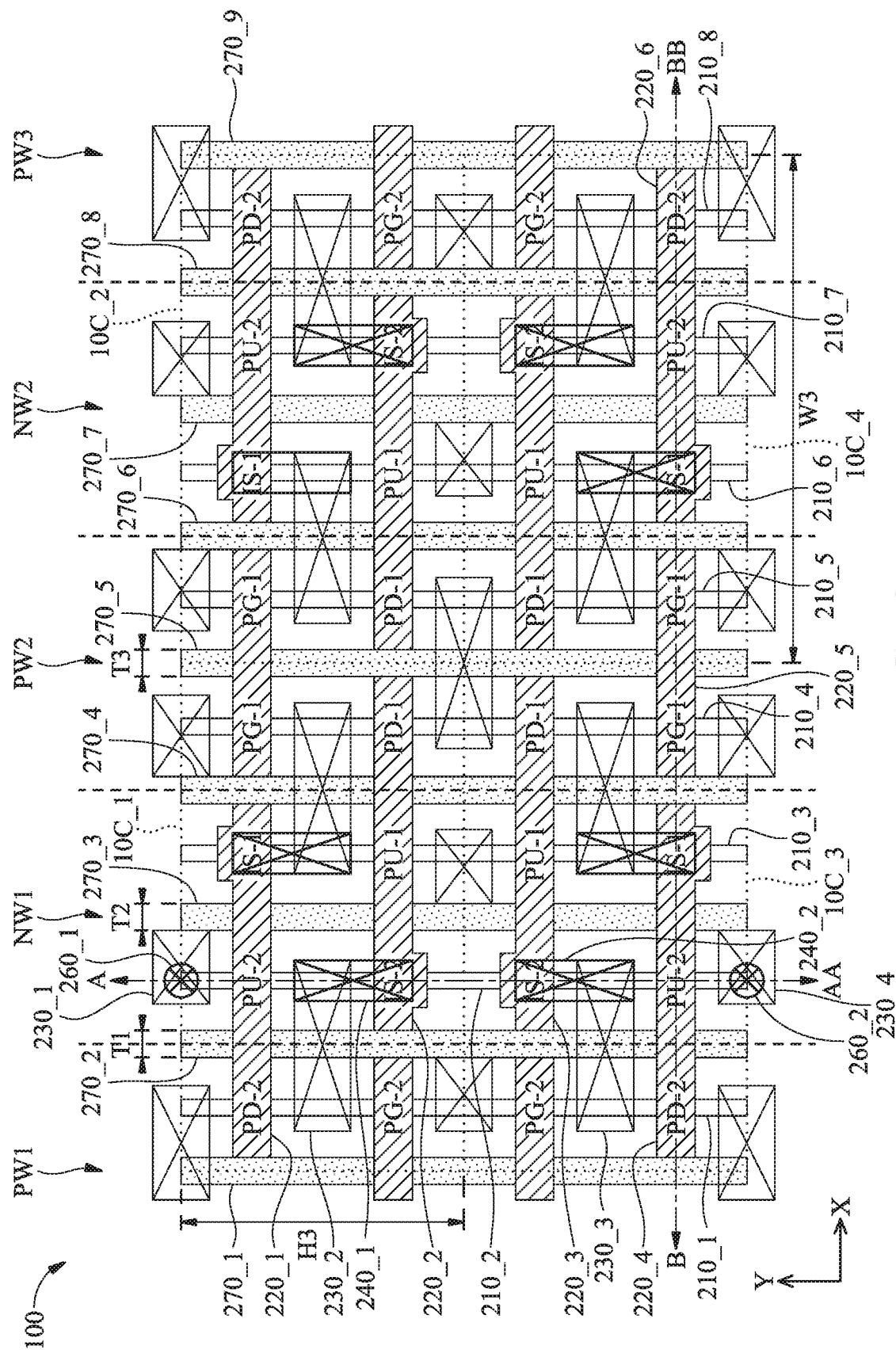
FIG. 6 illustrates a layout of features of a cell array of a memory, in accordance with some embodiments of the disclosure.

FIG. 6 illustrates a layout of features of a cell array 100 of a memory, in accordance with some embodiments of the disclosure. In the cell array 100, the memory cells 10C_1 and 10C_2 are arranged in the same row, and the memory cells 10C_3 and 10C_4 are arranged in the same row. Furthermore, the outer boundary of each of the memory cells 10C_1 through 10C_4 is illustrated using dashed lines. As described above, the memory cells 10C_1 through 10C_4 have the same cell height H3 and the same cell weight W3, as shown in FIG. 4. The memory cells 10C_1 and 10C_3 are arranged in mirror symmetry along the X-direction, and the memory cells 10C_2 and 10C_4 are arranged in mirror symmetry along the X-direction. Furthermore, the memory cells 10C_1 and 10C_2 are arranged in mirror symmetry along the Y-direction, and the memory cells 10C_3 and 10C_4 are arranged in mirror symmetry along the Y-direction. It should be noted that the configuration of the memory cells 10C_1 through 10C_4 in the cell array 100 is used as an illustration, and not to limit the disclosure.

In various embodiments, the row in the cell array 100 may include more memory cells or fewer memory cells than the layout shown in FIG. 6. In various embodiments, the cell array 100 may include more rows or fewer rows and more columns or fewer columns than the layout shown in FIG. 6. Furthermore, the memory cells of the cell array 100 have the similar configuration in layout. Moreover, the memory cell may be the memory cell 10A of FIG. 2, the memory cell 10B of FIG. 3, the memory cell 10C of FIG. 4, or the memory cell 10D of FIG. 5.

As described above, the semiconductor fins 210_1 through 210_8 extending in the Y-direction are formed over the N-type well regions NW1 and NW2 and the P-type well regions PW1 through PW3, and the semiconductor fins 210_1 through 210_4 and the semiconductor fins 210_5 through 210_8 are the continuous fin lines across the memory cells 10A arranged in the same column of the cell array. In some embodiments, the semiconductor fins 210_1 through 210_8 are Si fins. In some embodiments, the semiconductor fins 210_1, 210_4, 210_5, and 210_8 over the P-type well regions PW1 through PW3 are Si fins, and the semiconductor fins 210_2, 210_3, 210_6 and 210_7 over the N-type well regions NW1 and NW2 are SiGe fins. In some embodiments, the Ge atomic concentration of the SiGe fins is from about 5% to about 35%.

Figure 7A:
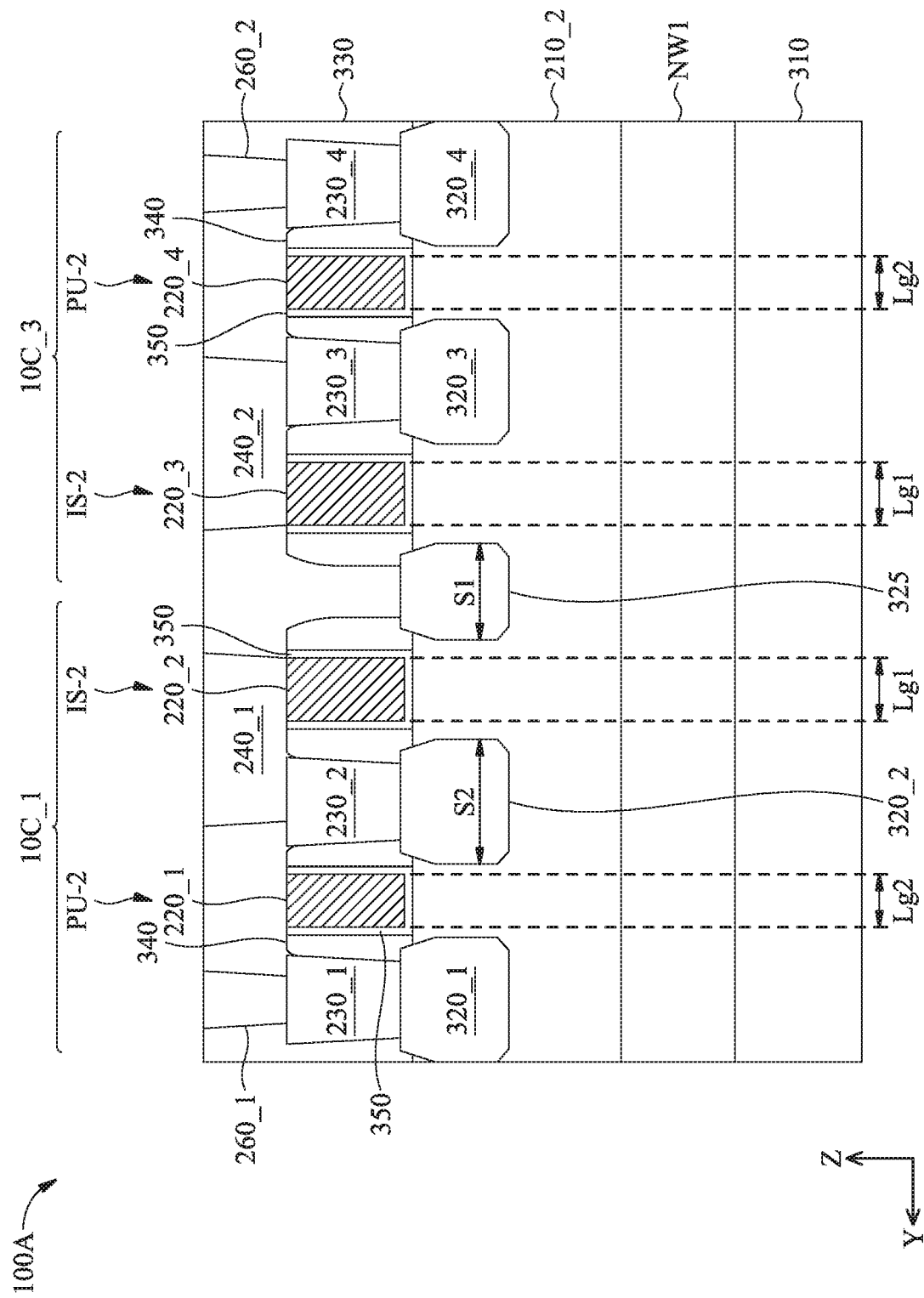
FIG. 7A illustrates a cross-sectional view of the semiconductor structure of the cell array along line A-AA in FIG. 6, in accordance with some embodiments of the disclosure.

FIG. 7A illustrates a cross-sectional view of the semiconductor structure of the cell array 100A along line A-AA in FIG. 6, in accordance with some embodiments of the disclosure. In some embodiments, the substrate 310 is a Si substrate. In some embodiments, the material of the substrate 310 is selected from a group consisting of bulk-Si, SiP, SiGe, SiC, SiPC, Ge, SOI-Si, SOI-SiGe, III-VI material, and combinations thereof. The N-type well region NW1 is formed over the substrate 310. The semiconductor fin 210_2 is a Si fin formed on the N-type well region NW1.

In the memory cell 10C_1, the source/drain regions 320_1 and 320_2 of the pull-up transistor PU-2 are formed by the P-type doping regions on the semiconductor fin 210_2. The contacts 230_1 and 230_2 are formed over the source/drain regions 320_1 and 320_2, respectively. A via 260_1 is formed over the contact 230_1. The source/drain regions 320_2 and 325 of the isolation transistor IS_1 are formed by the P-type doping regions on the semiconductor fin 210_2. Furthermore, the Inter-Layer Dielectric (ILD) layer 330 is formed over the source/drain region 325. In other words, no contact is formed over the source/drain region 325. In some embodiments, the ILD layer 330 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like.

In the memory cell 10C_3, the source/drain regions 320_3 and 320_4 of the pull-up transistor PU-2 are formed by the P-type doping regions on the semiconductor fin 210_2. The contacts 230_3 and 230_4 are formed over the source/drain regions 320_3 and 320_4, respectively. As described above, no contact is formed over the source/drain region 325 of the isolation transistor IS_1.

In some embodiments, the source/drain silicide regions (not shown) are formed on the source/drain regions 320_1 through 320_4. In some embodiments, each of the contacts 230_1 through 230_4 includes a metal plug (not shown) and a high-K dielectric (not shown) formed on the sidewall of the metal plug. In other words, the metal plug is surrounded by the high-K dielectric. In order to simplify the description, the source/drain silicide regions, the metal plugs, and the high-K dielectric will be omitted.

In the memory cell 10C_1, the gate electrode 220_1 is formed over the gate dielectrics 350 and is positioned over the top surface of the semiconductor fin 210_2 and between the source/drain regions 320_1 and 320_2. Furthermore, the gate electrode 220_1 has a gate length of Lg2. The semiconductor fin 210_2 overlapping the gate electrode 220_1, may serve as a Si channel region of the pull-up transistor PU-2. Furthermore, the spacers 340 are formed on opposite sides of the gate electrode 220_1. Thus, the gate electrode 220_1, the corresponding gate dielectrics 350 and the corresponding spacers 340 over the semiconductor fin 210_2 form a gate structure for the pull-up transistor PU-2.

In the memory cell 10C_1, the gate electrode 220_2 is formed over the gate dielectrics 350 and is positioned over the top surface of the semiconductor fin 210_2 and between the source/drain regions 320_2 and 325. The semiconductor fin 210_2 overlapping the gate electrode 220_2, may serve as a Si channel region of the isolation transistor IS_2. Furthermore, the gate electrode 220_2 is coupled to the contact 230_2 through the contact 240_1. As described above, The contact 240_1 is a butt contact, and includes a portion over, and electrically connected to, the gate electrode 220_2. Furthermore, the gate electrode 220_2 has a gate length of Lg1.

In the memory cell 10C_3, the gate electrode 220_4 is formed over the gate dielectrics 350 and is positioned over the top surface of the semiconductor fin 210_2 and between the source/drain regions 320_3 and 320_4. The semiconductor fin 210_2 overlapping the gate electrode 220_4, may serve as a Si channel region of the pull-up transistor PU-2. Furthermore, the spacers 340 are formed on opposite sides of the gate electrode 220_1. Thus, the gate electrode 220_4, the corresponding gate dielectrics 350 and the corresponding spacers 340 over the semiconductor fin 210_2 form a gate structure for the pull-up transistor PU-2. Furthermore, the gate electrode 220_4 has a gate length of Lg2.

In the memory cell 10C_3, the gate electrode 220_3 is formed over the gate dielectrics 350 and is positioned over the top surface of the semiconductor fin 210_2 and between the source/drain regions 320_3 and 325. The semiconductor fin 210_2 overlapping the gate electrode 220_3, may serve as a Si channel region of the isolation transistor IS_2. Furthermore, the gate electrode 220_3 is coupled to the contact 230_3 through the contact 240_2. As described above, The contact 240_2 is a butt contact, and includes a portion over, and electrically connected to, the gate electrode 220_2. Furthermore, the gate electrode 220_3 has a gate length of Lg1.

The gate dielectric layer 350 may be a single layer or multiple layers. The gate dielectric layer 350 is made of silicon oxide (SiOx), silicon nitride (SixNy), silicon oxynitride (SiON), dielectric material(s) with high dielectric constant (high-k), or a combination thereof. In some embodiments, the gate dielectric layer 350 is deposited by a plasma enhanced chemical vapor deposition (PECVD) process or by a spin coating process. The high dielectric constant (high-k) material may be hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material.

In some embodiments, the source/drain regions of the PMOS transistors (e.g., PU-1, PU-2, IS-1 and IS_2) in the memory cell 10A through 10D are formed by epitaxy material, and the epitaxy material is selected from a group consisting of SiHe, SiGeC, Ge, Si, and combinations thereof. Furthermore, the source/drain regions of the NMOS transistors (e.g., PD-1, PD-2, PG-1 and PG_2) in the memory cell 10A through 10D are formed by epitaxy material, and the epitaxy material is selected from a group consisting of SiP, SiC, SiPC, SiAs, Si, and combinations thereof.

As described above, the gate electrode corresponding to the isolation transistor IS-1/IS-2 has an extra portion (or a jog) (as shown in 222 of FIG. 2) that form the longer gate length Lg1. Therefore, the gate length Lg1 of the isolation transistor IS-2 is greater than the gate length Lg2 of the pull-up transistor PU-2. Furthermore, the width S2 of the source/drain regions 320_1 through 320_4 is greater than the width S1 of the source/drain region 325. In some embodiments, the ratio of the widths S2 and S1 is within a range from about 1.05 to about 1.5. As described above, due to the longer gate length Lg1, the threshold (Isoff) leakage is decreased, and the isolation margin between the source/drain region (e.g., 325) and the butt contact (e.g., 240_1, 240_2) is increased for the isolation transistors IS-1 and IS-2, thereby avoiding bridge leakage between the butt contact and the source/drain region 325.

In some embodiments, the width S2 of the source/drain regions 320_1 through 320_4 is greater than the Si channel regions of the pull-up transistors PU-2, e.g., the gate length Lg2. In some embodiments, the source/drain regions 320_1 through 320_4 and the source/drain region 325 have the same depth.

In some embodiments, each gate structure of the gate electrodes 220_1 through 220_4 includes multiple material structure selected from a group consisting of metals/high-K dielectric structure, Al/refractory metals/high-K dielectric structure, silicide/high-K dielectric structure, or a combination thereof.

Figure 7B:
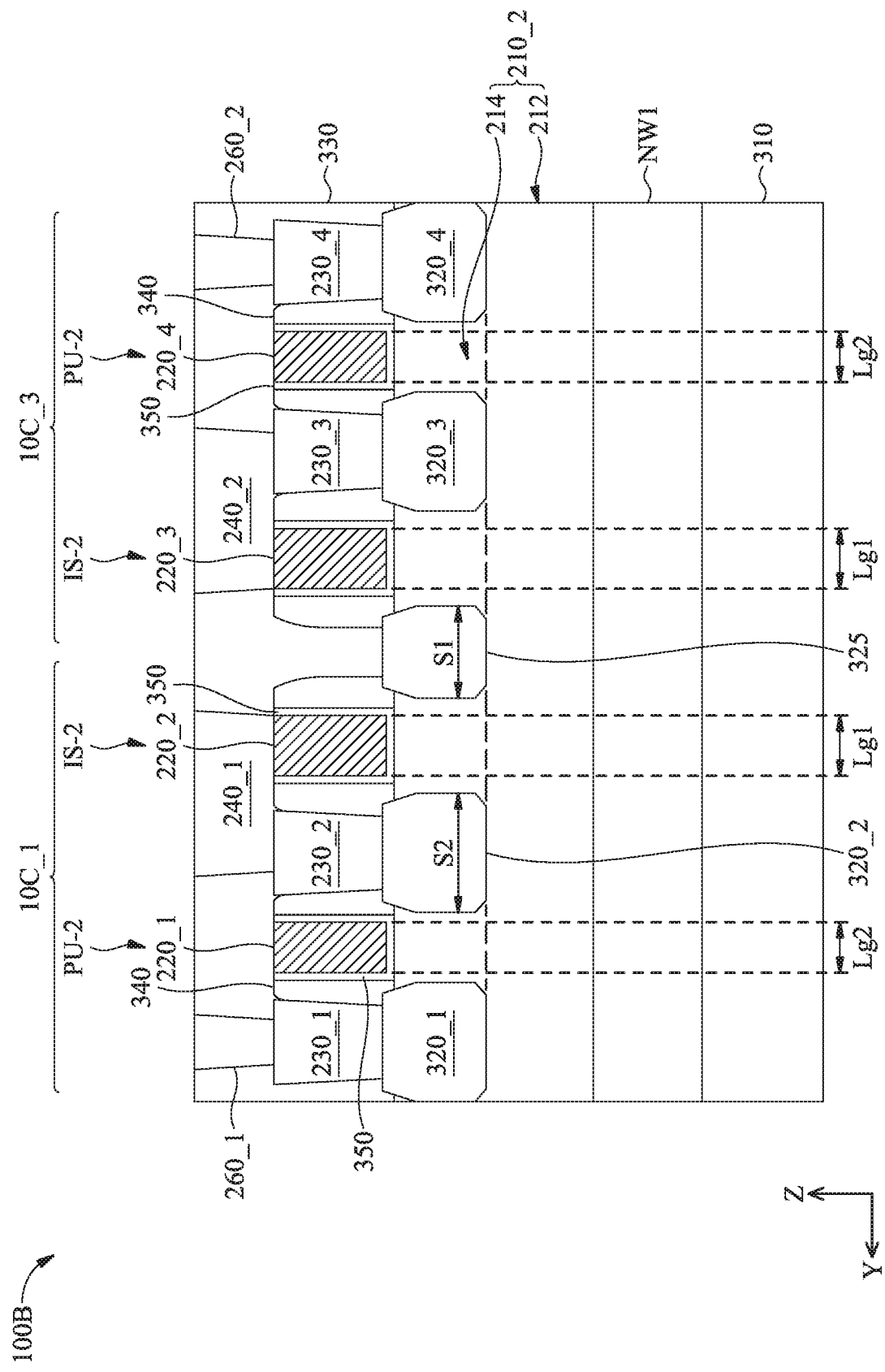
FIG. 7B illustrates a cross-sectional view of the semiconductor structure of the cell array along line A-AA in FIG. 6, in accordance with some embodiments of the disclosure.

FIG. 7B illustrates a cross-sectional view of the semiconductor structure of the cell array 100B along line A-AA in FIG. 6, in accordance with some embodiments of the disclosure. The configuration of the cell array 100B of FIG. 7B is similar to the configuration of the cell array 100A of FIG. 7A. The difference between the cell array 100A and the cell array 100B is that the semiconductor fin 210_2 is a SiGe fin formed on the N-type well region NW1.

In FIG. 7B, the semiconductor fin 210_2 includes a first portion 212 and a second portion 214. The first portion 212 includes Si. Compared with the first portion 212, the second portion 214 further includes SiGe. In some embodiments, the Ge atomic concentration of the second portion 214 is from about 5% to about 35%. In some embodiments, the second portion 214 is formed by performing a dielectric deposition, patterning to expose the predetermined channel region and following a first SiGe concentration epi-growth on exposed channel region. For example, using mask to etch a predetermined area on the Si substrate 310 with a depth, and then the non-etch portion is blocked. Next, the SiGe epitaxy growth material is formed for the second portion 214, and then subsequent processes are performed. In some embodiments, the height (or depth) of the second portion 214 is within a range from about 35 nm to about 70 nm, and the height (or depth) of the first portion 212 is within a range of from about 40 nm to about 200 nm.

Figure 8:
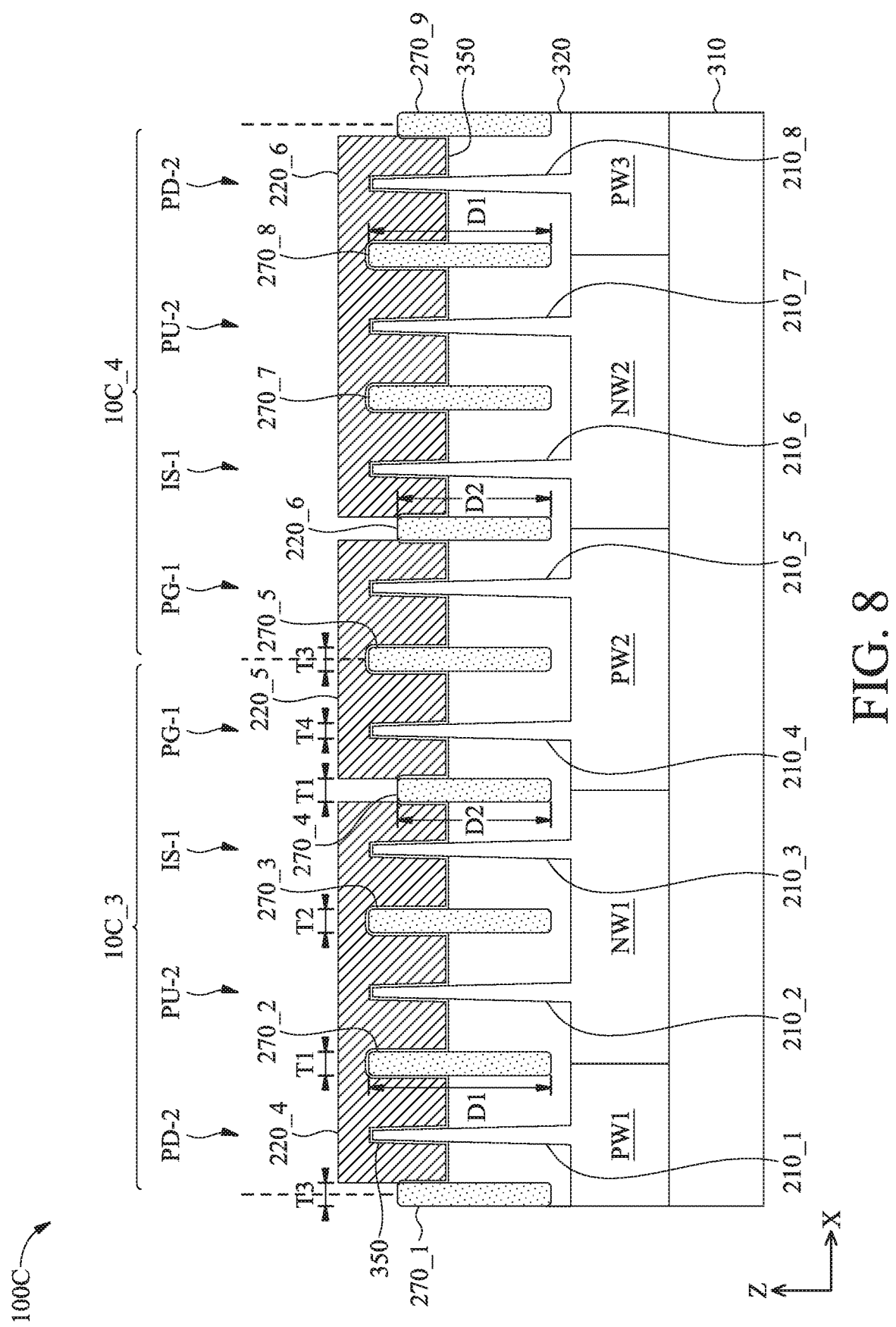
FIG. 8 illustrates a cross-sectional view of the semiconductor structure of the cell array along line B-BB in FIG. 6, in accordance with some embodiments of the disclosure.

FIG. 8 illustrates a cross-sectional view of the semiconductor structure of the cell array 100C along line B-BB in FIG. 6, in accordance with some embodiments of the disclosure. The P-type well regions PW1 through PW3 and the N-type well regions NW1 and NW2 are formed over the substrate 310. In some embodiments, the substrate 310 is a Si substrate. In some embodiments, the material of the substrate 310 is selected from a group consisting of bulk-Si, SiP, SiGe, SiC, SiPC, Ge, SOI-Si, SOI-SiGe, III-VI material, and combinations thereof.

In the cell array 100C, the semiconductor fins 210_1 through 210_8 are Si fins. The semiconductor fin 210_1 is formed on the P-type well region PW1. The semiconductor fins 210_2 and 210_3 are formed on the N-type well region NW1, and the semiconductor fins 210_2 and 210_3 are separated from each other by the shallow trench isolation (STI) 320. The semiconductor fins 210_4 and 210_5 are formed on the P-type well region PW2, and the semiconductor fins 210_4 and 210_5 are separated from each other by the STI 320. The semiconductor fins 210_6 and 210_7 are formed on the N-type well region NW2, and the semiconductor fins 210_6 and 210_7 are separated from each other by the STI 320. The semiconductor fin 210_8 is formed on the P-type well region PW3.

In the memory cell 10C_3, the gate electrode 220_4 is formed over the gate dielectric layer 350 and is positioned over the top surface of the semiconductor fins 210_1 through 210_3. The semiconductor fin 210_1 overlapping the gate electrode 220_4 may serve as a Si channel region of the pull-down transistor PD-2. Furthermore, the semiconductor fin 210-2 overlapping the gate electrode 220_4 may serve as a Si channel region of the pull-up transistor PU-2. Moreover, the semiconductor fin 210-3 overlapping the gate electrode 220_4 may serve as a Si channel region of the isolation transistor IS-1. Furthermore, the gate electrode 220_5 is formed over the gate dielectric layer 350 and is positioned over the top surface of the semiconductor fin 210_4. The semiconductor fin 210_4 overlapping the gate electrode 220_5 may serve as a Si channel region of the pass-gate transistor PG-1.

In some embodiments, the gate electrodes 220_4 through 220_6 are made of conductive material, such as aluminum (Al), copper (Cu), tungsten (W), titanium (Ti), tantalum (Ta), or other applicable materials.

One or more work-function layers (not shown) are formed between the gate dielectric layer 350 and the gate electrodes 220_4 through 220_6. In some embodiments, the work-function layer of the transistors in the memory cell is made of the same metal material. In some embodiments, the work function layer is selected from a group consisting of TiN, TiAl, TiAlN, TaN, TaAl, TaAlN, TaAlC, TaCN, refractory metal, Al, W, Ni, Ti, Ru, Co, Pt, and combinations thereof. In some embodiments, the work function layer is made of metal material, and the metal material may include N-work-function metal for NMOS transistors or P-work-function metal for PMOS transistors. The N-work-function metal includes W, Cu, Ti, Ag, Al, TiAl, TiAlN, TaC, TaCN, TaSiN, Mn, Zr or a combination thereof. The P-work-function metal includes TiN, WN, TaN, Ru or a combination thereof.

In the memory cell 10C_4, the configuration of the transistors PG-1, IS-1, PU-2 and PD-2 is similar to the configuration of the memory cell 10C_3 and will therefore not be described again herein.

As described above, the dielectric-base fins 270_1 through 270_9 are formed in the memory cells 10C_3 and 10C_4. The dielectric-base fins 270_1 through 270_9 are divided into a first group and a second group. Using the memory cell 10C_3 as an example, the dielectric-base fins of the first group include the dielectric-base fins 270_2 and 270_3 that are located under the gate electrode 220_4 and have a depth D1 along the Z-direction. Furthermore, the dielectric-base fins of the second group include the dielectric-base fins 270_1 and 270_4 that are located outside the gate electrode 220_4 and have a depth D2. The dielectric-base fins of the second group are shorter than the dielectric-base fins of the first group in depth, i.e., D1>D2. In some embodiments, the depth D1 of the first group is greater than the depth D2 of the second group at least 5 nm. In some embodiments, the depth D1 of the first group and the depth D2 of the second group are higher than 50 nm.

As described above, the dielectric-base fin 270_2 over an interface between the P-type well region PW1 and the N-type well region NW1 has a width T1, the dielectric-base fin 270_3 over the N-type well region NW1 has a width T2, and the dielectric-base fin 270_1 over the P-type well region PW1 has a width T3.

The widths T1, T2 and T3 are wider than the width T4 of the semiconductor fins 210_1 through 210_8. Furthermore, the widths T1, T2 and T3 are within a range from about 5 nm to about 40 nm. In some embodiments, a ratio of the width T1, T2 or T3 and the width T4 is within a range from about 1.2 to about 3. In some embodiments, the dielectric-base fins 270_1 through 270_9 have similar widths, e.g., T1≈T2≈T3. In some embodiments, the width T3 is wider than the widths T1 and T2. In other words, the dielectric-base fins disposed at the cell boundary (e.g., the dielectric-base fins 270_1, 270_5 and 270_9) have wider width than the dielectric-base fins in cell inner (e.g., the dielectric-base fins 270_2 through 270_4 and 270_6 through 270_8). In some embodiments, a ratio of the width T3 and the width T1/T2 is greater than about 10%.

Embodiments of semiconductor structure including multiple SRAM cells are provided. The SRAM cell includes a pair of cross-coupled inverters Inverter-1 and Inverter-2, two pass-gate transistors PG-1 and PG-2, and two isolation transistors IS-1 and IS-2. The inverter Inverter-1 includes a pull-up transistor PU-1 and a pull-down transistor PD-1. The inverter Inverter-2 includes a pull-up transistor PU-2 and a pull-down transistor PD-2. The gate length Lg1 of the isolation transistors IS-1/IS-2 is different than the gate length Lg2 of the other transistors in the SRAM cell. The gate length Lg1 is obtained by the gate electrode corresponding to the isolation transistors IS-1/IS-2 with an extra portion (e.g., 222 of FIG. 2). Furthermore, the continuous fins are used in the SRAM cells arranged in the same column for the transistors PG-1 and PG-2, PD-1 and PD-2, and PU-1 and PU-2, so as to create fully balance environment for SRAM cell manufacturing. Furthermore, the isolation transistors IS-1 and IS-2 are arranged adjacent with the pull-up transistors PU-1 and PU-2. The isolation transistor IS-1/IS-2 has common drain and gate, and the source of the isolation transistor IS-1/IS-2 is shared with the adjacent SRAM cell. The SRAM cell further includes multiple dielectric-base fins. The dielectric-base fins are divided into a first group and a second group. The dielectric-base fins of the first group include the dielectric-base fins in cell inner and located under the gate electrodes. The dielectric-base fins of the second group disposed at the cell boundary and outside the gate electrode. The dielectric-base fins of the second group are shorter than the dielectric-base fins of the first group in depth. In the SRAM cell, the dielectric-base fins are located between the two adjacent continuous fin lines, to create fully balance environment for SRAM cell manufacturing.

In some embodiments, a semiconductor structure is provided. The semiconductor structure includes a substrate and a plurality of memory cells arranged in a cell array over the substrate. Each of the memory cells includes a latch circuit, a pass-gate transistor, and an isolation transistor. The latch circuit is formed by two cross-coupled inverters. The pass-gate transistor is coupled between an output terminal of the latch circuit and a bit line. The isolation transistor includes a drain and a gate, both of which are coupled to the output terminal of the latch circuit, and a source that is floating. A first gate length of the isolation transistor is greater than a second gate length of the pass-gate transistor and a plurality of transistors within the latch circuit.

In some embodiments, a semiconductor structure is provided. The semiconductor structure includes a substrate and a plurality of memory cells arranged in a plurality of rows and a plurality of columns of a cell array over the substrate. Each of the memory cells includes a latch circuit, a pass-gate transistor, and an isolation transistor. The latch circuit is formed by two cross-coupled inverters. The pass-gate transistor couples an output of the latch circuit to a bit line. The isolation transistor includes a drain and a gate, both of which are coupled to the latch circuit, and a source that is floating. The isolation transistor is a PMOS transistor formed by a first fin, and the gate length of the isolation transistor is different from that of the pass-gate transistor and the plurality of transistors of the latch circuit. The first fin is shared by the isolation transistors of the memory cells arranged in the same column of the cell array.

In some embodiments, a semiconductor structure is provided. The semiconductor structure includes a substrate and a plurality of memory cells arranged in a cell array over the substrate. Each of the memory cells includes a latch circuit, a first pass-gate transistor, a first isolation transistor, a second isolation transistor, a second pass-gate transistor and a plurality of dielectric-base fins. The latch circuit is formed by a first inverter and a second inverter cross-coupled. The first inverter includes a first pull-up transistor and a first pull-down transistor, and the second inverter includes a second pull-up transistor and a second pull-down transistor. The first pass-gate transistor is coupled between an output terminal of the first inverter and a bit line. The first pass-gate transistor and the first pull-down transistor are formed by a first fin over a P-type well region over the substrate. The first isolation transistor includes a drain and a gate, both coupled to the output terminal of the first inverter, and a source that is floating. The first isolation transistor and the first pull-up transistor are formed by a second fin over an N-type well region over the substrate. The second isolation transistor includes a drain and a gate, both coupled to an output terminal of the second inverter, and a source that is floating. The second isolation transistor and the second pull-up transistor are formed by a third fin over the N-type well region. The second pass-gate transistor is coupled between the output terminal of the second inverter and a complementary bit line. The second pass-gate transistor and the second pull-down transistor are formed by a fourth fin over another P-type well region over the substrate. The plurality of dielectric-base fins extends parallel to the first, second, third and fourth fins. The first, second, third and fourth fins and the dielectric-base fins are alternately arranged. A first gate length of the first and second isolation transistors is greater than a second gate length of the first and second pull-up transistors.

The foregoing outlines nodes of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate; and
a plurality of memory cells arranged in a cell array over the substrate, wherein each of the memory cells comprises:
a latch circuit formed by two cross-coupled inverters;
a pass-gate transistor coupled between an output terminal of the latch circuit and a bit line; and
an isolation transistor, comprising a drain and a gate, both coupled to the output terminal of the latch circuit, and a source that is floating,
wherein a first gate length of the isolation transistor is greater than a second gate length of the pass-gate transistor and a plurality of transistors within the latch circuit.

2. The semiconductor structure as claimed in claim 1, wherein a ratio of the first gate length and the second gate length is greater than 10%.

3. The semiconductor structure as claimed in claim 1, wherein the isolation transistor is a PMOS transistor formed by a SiGe fin, wherein Ge atomic concentration of the SiGe fin is from 5% to 35%.

4. The semiconductor structure as claimed in claim 1, wherein the source of the isolation transistor is formed by a first P-type doping region over an N-type well region over the substrate, and the drain of the isolation transistor is formed by a second P-type doping region over the N-type well region, wherein the first P-type doping region is narrower than the second P-type doping region.

5. The semiconductor structure as claimed in claim 1, wherein each of the cross-coupled inverters comprises:
a pull-up transistor disposed on an N-type well region over the substrate; and
a pull-down transistor disposed on a P-type well region over the substrate,
wherein the pass-gate transistor and the pull-down transistor are formed by a first fin over the P-type well region, and the pull-up transistor and isolation transistor are formed by a second fin over the N-type well region.

6. The semiconductor structure as claimed in claim 5, wherein each of the memory cells further comprises:
a first dielectric-base fin disposed between the first and second fins and over an interface between the N-type well region and the P-type well region; and
a second dielectric-base fin disposed at a cell boundary of the memory cell and over the P-type well region,
wherein the first fin is disposed between the first and second dielectric-base fins.

7. The semiconductor structure as claimed in claim 6, wherein a first depth of the first dielectric-base fin is greater than a second depth of the second dielectric-base fin.

8. The semiconductor structure as claimed in claim 6, wherein source/drain regions of the pull-down transistor and the pass-gate transistor are in contact with the first or second dielectric-base fin.

9. A semiconductor structure, comprising:
a substrate; and
a plurality of memory cells arranged in a plurality of rows and a plurality of columns of a cell array over the substrate, wherein each of the memory cells comprises:
a latch circuit formed by two cross-coupled inverters;
a pass-gate transistor coupling an output of the latch circuit to a bit line; and
an isolation transistor, comprising a drain and a gate, both coupled to the latch circuit, and a source that is floating;
wherein the isolation transistor is a PMOS transistor formed by a first fin, and a gate length of the isolation transistor is different from that of the pass-gate transistor and a plurality of transistors of the latch circuit,
wherein the first fin is shared by the isolation transistors of the memory cells arranged in the same column of the cell array.

10. The semiconductor structure as claimed in claim 9, wherein a gate length ratio of the isolation transistor and the transistors of the latch circuit is greater than 10%.

11. The semiconductor structure as claimed in claim 9, wherein the first fin is a SiGe fin, and Ge atomic concentration of the SiGe fin is from 5% to 35%.

12. The semiconductor structure as claimed in claim 9, wherein the source of the isolation transistor is formed by a first P-type doping region over an N-type well region over the substrate, and the drain of the isolation transistor is formed by a second P-type doping region over the N-type well region, wherein the first P-type doping region is narrower than the second P-type doping region.

13. The semiconductor structure as claimed in claim 9, wherein each of the cross-coupled inverters comprises:
   a pull-up transistor disposed on an N-type well region over the substrate; and
   a pull-down transistor disposed on a P-type well region over the substrate,
   wherein the pass-gate transistor and the pull-down transistor are formed by a second fin over the P-type well region, and the pull-up transistor and isolation transistor are formed by the first fin over the N-type well region.

14. The semiconductor structure as claimed in claim 13, wherein each of the memory cells further comprises:
   a first dielectric-base fin disposed between the first and second fins and over an interface between the N-type well region and the P-type well region; and
   a second dielectric-base fin disposed at a cell boundary of the memory cell and over the P-type well region,
   wherein the second fin is disposed between the first and second dielectric-base fins.

15. The semiconductor structure as claimed in claim 14, wherein a first depth of the first dielectric-base fin is greater than a second depth of the second dielectric-base fin.

16. The semiconductor structure as claimed in claim 14, wherein the first fin, the second fin, the first dielectric-base fin, and the second dielectric-base fin are continuous fin lines across the memory cells arranged in the same column of the cell array.

17. A semiconductor structure, comprising:
   a substrate; and
   a plurality of memory cells arranged in a cell array over the substrate, wherein each of the memory cells comprises:
      a latch circuit formed by a first inverter and a second inverter cross-coupled, wherein the first inverter comprises a first pull-up transistor and a first pull-down transistor, and the second inverter comprises a second pull-up transistor and a second pull-down transistor;
      a first pass-gate transistor coupled between an output terminal of the first inverter and a bit line, wherein the first pass-gate transistor and the first pull-down transistor are formed by a first fin over a P-type well region over the substrate;
      a first isolation transistor, comprising a drain and a gate, both coupled to the output terminal of the first inverter, and a source that is floating, wherein the first isolation transistor and the first pull-up transistor are formed by a second fin over an N-type well region over the substrate;
      a second isolation transistor, comprising a drain and a gate, both coupled to an output terminal of the second inverter, and a source that is floating, wherein the second isolation transistor and the second pull-up transistor are formed by a third fin over the N-type well region;
      a second pass-gate transistor coupled between the output terminal of the second inverter and a complementary bit line, wherein the second pass-gate transistor and the second pull-down transistor are formed by a fourth fin over another P-type well region over the substrate; and
      a plurality of dielectric-base fins extending parallel to the first, second, third and fourth fins,
      wherein the first, second, third and fourth fins and the dielectric-base fins are alternately arranged,
      wherein a first gate length of the first and second isolation transistors is greater than a second gate length of the first and second pull-up transistors.

18. The semiconductor structure as claimed in claim 17, wherein a ratio of the first gate length and the second gate length is greater than 10%.

19. The semiconductor structure as claimed in claim 17, wherein the source of each of the first and second isolation transistors is formed by a first P-type doping region over the N-type well region, and the drain of each of the first and second isolation transistors is formed by a second P-type doping region over the N-type well region, wherein the first P-type doping region is narrower than the second P-type doping region.

20. The semiconductor structure as claimed in claim 17, wherein the dielectric-base fins are divided into a first group and a second group, wherein each of the dielectric-base fins of the first group is disposed between two adjacent fins and has a first depth, and each of the dielectric-base fins of the first group is disposed at a cell boundary of the memory cell and has a second depth, wherein the first depth is greater than the second depth.

* * * * *